(12) United States Patent
Pursche et al.

(10) Patent No.: US 9,214,367 B2
(45) Date of Patent: Dec. 15, 2015

(54) APPARATUS AND METHOD FOR THE THERMAL TREATMENT OF SUBSTRATES

(75) Inventors: Oliver Pursche, Ulm (DE); Peter Volk, Griesingen (DE)

(73) Assignee: Centrotherm Photovoltaics AG, Blaubeuren (DE)

( * ) Notice: Subject to any disclaimer, the term of this patent is extended or adjusted under 35 U.S.C. 154(b) by 25 days.

(21) Appl. No.: 13/988,825

(22) PCT Filed: Dec. 16, 2011

(86) PCT No.: PCT/EP2011/006387
§ 371 (c)(1),
(2), (4) Date: Jun. 19, 2013

(87) PCT Pub. No.: WO2012/079773
PCT Pub. Date: Jun. 21, 2012

(65) Prior Publication Data
US 2014/0051265 A1 Feb. 20, 2014

Related U.S. Application Data

(60) Provisional application No. 61/439,416, filed on Feb. 4, 2011.

(30) Foreign Application Priority Data

Dec. 17, 2010 (DE) .......................... 10 2010 054 919

(51) Int. Cl.
| F27D 11/00 | (2006.01) |
| H01L 21/67 | (2006.01) |
| H01L 21/677 | (2006.01) |
| H01L 31/18 | (2006.01) |
| H01L 31/0392 | (2006.01) |

(52) U.S. Cl.
CPC .... *H01L 21/67103* (2013.01); *H01L 21/67109* (2013.01); *H01L 21/67754* (2013.01); *H01L 31/0392* (2013.01); *H01L 31/18* (2013.01); *Y02E 10/50* (2013.01)

(58) Field of Classification Search
CPC .................. H01L 21/67225; H01L 21/67248; H01L 21/67754; H01L 21/67103; H01L 21/67109; H01L 31/18; H01L 31/0392
See application file for complete search history.

(56) References Cited

U.S. PATENT DOCUMENTS 6,361,834 B1 3/2002 Shinohara
2008/0160462 A1* 7/2008 Herchen et al. ............... 430/330

FOREIGN PATENT DOCUMENTS

| JP | 2003-166785 | * | 6/2003 |
| JP | 2003166785 | | 6/2003 |
| JP | 2006-222124 | * | 8/2006 |
| JP | 2006222124 | | 8/2006 |

* cited by examiner

*Primary Examiner* — Shawntina Fuqua
(74) *Attorney, Agent, or Firm* — Tarolli, Sundheim, Covell & Tummino LLP

(57) ABSTRACT

The application describes an apparatus and a method for the thermal treatment of substrates, in particular thin film substrates for photovoltaic applications. The apparatus comprises at least one substrate carrier for supporting a substrate, a heating unit having at least one heating element for heating a substrate located on the substrate carrier and at least one heating element carrier for supporting the at least one heating element. The heating element carrier is designed to allow a local change in distance between the substrate carrier and the heating element, so as to be able to provide locally different heating intensities. In the method such a change in distance is carried out during the thermal treatment.

16 Claims, 9 Drawing Sheets

APPARATUS AND METHOD FOR THE THERMAL TREATMENT OF SUBSTRATES

RELATED APPLICATION

This application corresponds to PCT/EP2011/006387, filed Dec. 16, 2011, which claims the benefit of German Application No. 10 2010 054 919.3, filed Dec. 17, 2010, and U.S. Provisional Appln. Ser. No. 61/439,416, filed Feb. 4, 2011 the subject matter, of which is incorporated herein by reference in its entirety.

The present invention relates to an apparatus and a method for the thermal treatment of substrates, and in particular for the thermal treatment of large thin film substrates for photovoltaic applications.

In the semi-conductor and photovoltaic industry devices are known to undergo a plurality of different processing steps during their manufacturing. Thermal treatment of substrates, which later form the devices, is one such processing step.

In the semiconductor technology stationary apparatuses are typically used for the thermal treatment of substrates, in which the substrate to be treated, is kept stationary or in a fixed position with respect to a heating unit (however, it may be kept in a rotating manner). Heating of the substrates is often conducted by using rod-shaped emitters (lamps), e.g. tungsten halogen lamps. To achieve a relatively homogeneous emission profile on the surface of the substrate to be treated, a complex chamber geometry dispersing the "line shaped" lamp emission is required. To achieve a homogeneous emission across a larger area, it is moreover necessary to have a large number of heating lamps, which leads to high costs of such facilities. Moreover, the control of such lamp systems is also complex, in particular if an individual control is provided so as to increase the temperature homogeneity of the substrates. Emitters of the type mentioned above have a relatively short operating life, e.g. between 2000 and 6000 working hours, necessitating a periodic replacement, causing associated cost.

In the photovoltaic industry, in particular in the field of thin film solar cells, in which substrates having widths of between 60 cm to 140 cm are treated, continuous furnaces are typically used. Such continuous furnaces typically have an extended heating space, which is open at its opposed ends, as well as a transport unit for transporting substrates through the heating space. Also with such continuous furnaces it is known to employ emitters for heating the substrates. Usually they extend transverse to the transporting direction of the substrates, so as to achieve temperature homogeneity on the substrate. However, due to the required lengths of the emitters, the emitters have to be supplied with high voltages, which increases the overall costs for such continuous furnaces. Once again the limited operating life of such emitters cause high cost. Moreover such emitters do not provide the possibility to set different emission profiles across the length of the emitter, so as to compensate edge effects it required.

Furthermore, in the photovoltaic industry also tube heaters e.g. a coil-shaped resistance heater, are known through which the substrates to be treated can be transported in a longitudinal direction. These heating elements have the disadvantage of being inflexible with respect to the delivered heating profile and do not allow local adjustments. Moreover the tube heating systems are, due to the mass of the resistance heater, usually slow with respect to their response characteristics, so that rapid changes in temperature are not feasible.

Based on the prior art mentioned above, it is an object of the present invention to provide an apparatus and a method for the thermal treatment of substrates over-coming at least one of the problems of the prior art mentioned above.

According to the invention, an apparatus according to claim 1 and a method according to claim 17 are provided. Further embodiments of the invention are claimed in the respective dependent claims.

An apparatus for the thermal treatment of substrates, in particular thin film substrates for photovoltaic applications, comprises at least one substrate carrier, a heating unit having at least one heating element and at least one heating element carrier for supporting the at least one heating element. The heating element carrier is designed so as to permit local changes in distance between the substrate carrier and the heating element, i.e. a local movement of the at least one heating element relative to the substrate carrier. In so doing locally different settings of the emission profile of the heating elements on the substrate to be treated are to be achieved. It is important, that it is not the heating unit having the at least one heating element as a whole that is moved but that local movement is provided. Moving the heating unit as a wholly may optionally be provided in addition to the local movement.

Hereby, the emission profile of the heating elements can be adjusted in a simple and cost effective way in the desired manner. In particular it is possible to provide a heating output at the edge regions of the substrates differing from the heating output at the central region of the substrates, so as to balance edge effects when required and to provide improved temperature homogeneity.

According to one embodiment of the invention the at least one heating element carrier comprises at least one flexible element, such as a deformable and/or movable sheet metal, so as to provide local changes in distance, and means for deforming and/or moving this flexible element are provided. Such a flexible element, for example in the form of a sheet metal, provides simple means to change the distance between the heating element and the substrate carrier locally or sectionally. The means for deforming and/or moving the flexible element may comprise a chamber adjacent to the flexible element to which negative pressure and/or positive pressure can be applied, so as to deform and/or move the flexible element. This chamber can be the actual heating chamber or can also be a chamber on the side of the flexible element which is facing away from the heating space. Alternatively, it is also possible that means for deforming and/or moving the flexible element comprise a movable element contacting the flexible element and is preferably connected thereto. Such an element can, by means of its own movement, cause a local deformation and/or movement of the flexible element and can thus locally or sectionally change the distance between the heating element and the substrate carrier.

In a particularly preferred embodiment of the invention, the at least one heating element is flexible to allow a local change of distance. Providing a flexible heating element allows a particularly good adaptability of the emission profile thereof. The entire heating element can be flexible, or it can be composed of rigid and flexible sections.

According to a particularly preferred embodiment of the invention, the heating unit having the at least one heating element is preferably designed as a planar emitter, which forms a generally continuous emission surface within its dimensions. In the sense of this application generally continuous should be understood as clearances within the area of the emission surface being smaller than 30% and preferably smaller than 10%. Preferably, the at least one heating element is designed as a foil heater having a thickness in the range of millimeters, e.g. between 1 and 5 mm and preferably between 1.5 and 3 mm. Such foil heaters can exhibit sufficient mechanical robustness, while at the same time being flexible, so as to be able to provide a deformation. Preferably, the at least one heating element consists at least partially of one of the following materials: graphite, CFC, SIC or a similar material, or at least comprises one of these materials.

For a particularly simple design of the apparatus the at least one heating element is preferably at least partially glued, bonded, welded and/or ceramically fixed to the at least one heating element carrier. Thereby a strong, temperature resistant connection between the heating element and the heating element carrier permitting a common movement can be provided.

In one embodiment of the invention, the apparatus is designed as a continuous furnace comprising a tunnel-shaped heating space having side walls, a bottom wall and a top wall, wherein at least one of the walls, in particular the top wall of the heating space, forms the heating element carrier. In one preferred embodiment the top wall as well as the bottom wall of the furnace comprise heating element carriers having heating elements attached thereto. The heating elements are carried by the heating element carriers in a preferably opposed manner. In particular when the apparatus is a continuous furnace, the substrate carrier can be part of a conveying unit, in particular a transport belt, for transporting the substrate through the heating space.

The at least one heating element is preferably meander-shaped so as to have a homogeneous emission profile. The at least one heating element may have a shape corresponding to the shape of the substrate to be treated, so as to provide a homogeneous heating of all parts of the substrate.

According to one embodiment of the invention the heating unit is designed to have individually controlled sections. This can be achieved by a plurality of separate heating elements or by a unitary heating element to which power can be applied at different locations. Furthermore, the heating unit is preferably designed, to have different resistances in different sections. Thus, it can provide locally differing heating output/intensity without the need for deformation, for example by means of its shape.

The problem underlying the invention is also solved by a method for the thermal treatment of substrates, in particular thin film substrates for photovoltaics, wherein the substrate to be treated is supported on a substrate carrier opposite to a heating unit. The substrate is thermally treated by applying power to the heating unit and the distance between the at least one heating element of the heating unit and the substrate is changed during the thermal treatment to achieve the advantages mentioned above.

In the following, the invention is discussed in more detail with reference to the drawings; in the drawings.

Figure 1:
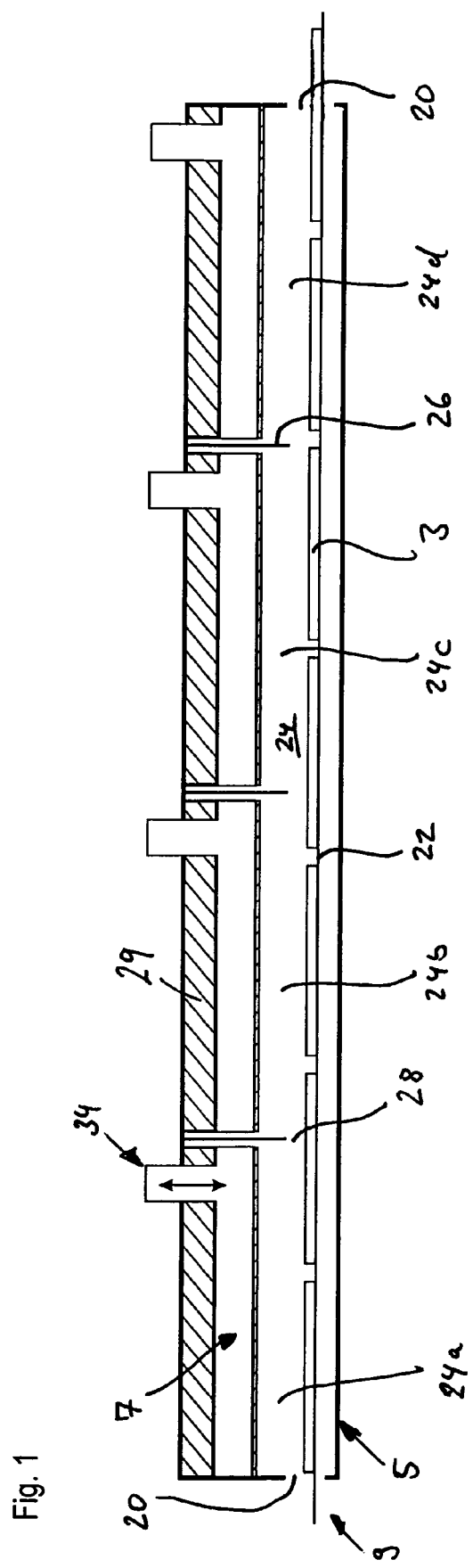
FIG. 1 shows a schematic longitudinal sectional view of a continuous furnace according to the present invention.

Expressions like top, bottom, right, left used in the following specification refer to the presentation in the drawings and should not be viewed as limiting, even though they can refer to a preferred orientation.

FIGS. 1 to 4 show schematic sectional views of an apparatus 1 according to the invention for thermal treatment of substrates 3, in particular large thin film substrates for the photovoltaic industry. The apparatus is configured as a so-called continuous furnace, wherein the substrates are transported through a heating space of apparatus 1 during a thermal treatment. However, the invention may also be employed in stationary furnaces, in which the substrates are held stationary during the thermal treatment, which does not exclude a rotation of the substrates.

Apparatus 1 generally consists of a housing unit 5, a plurality of heating units 7 and a transport unit 9 for the substrates 3.

Figure 2:
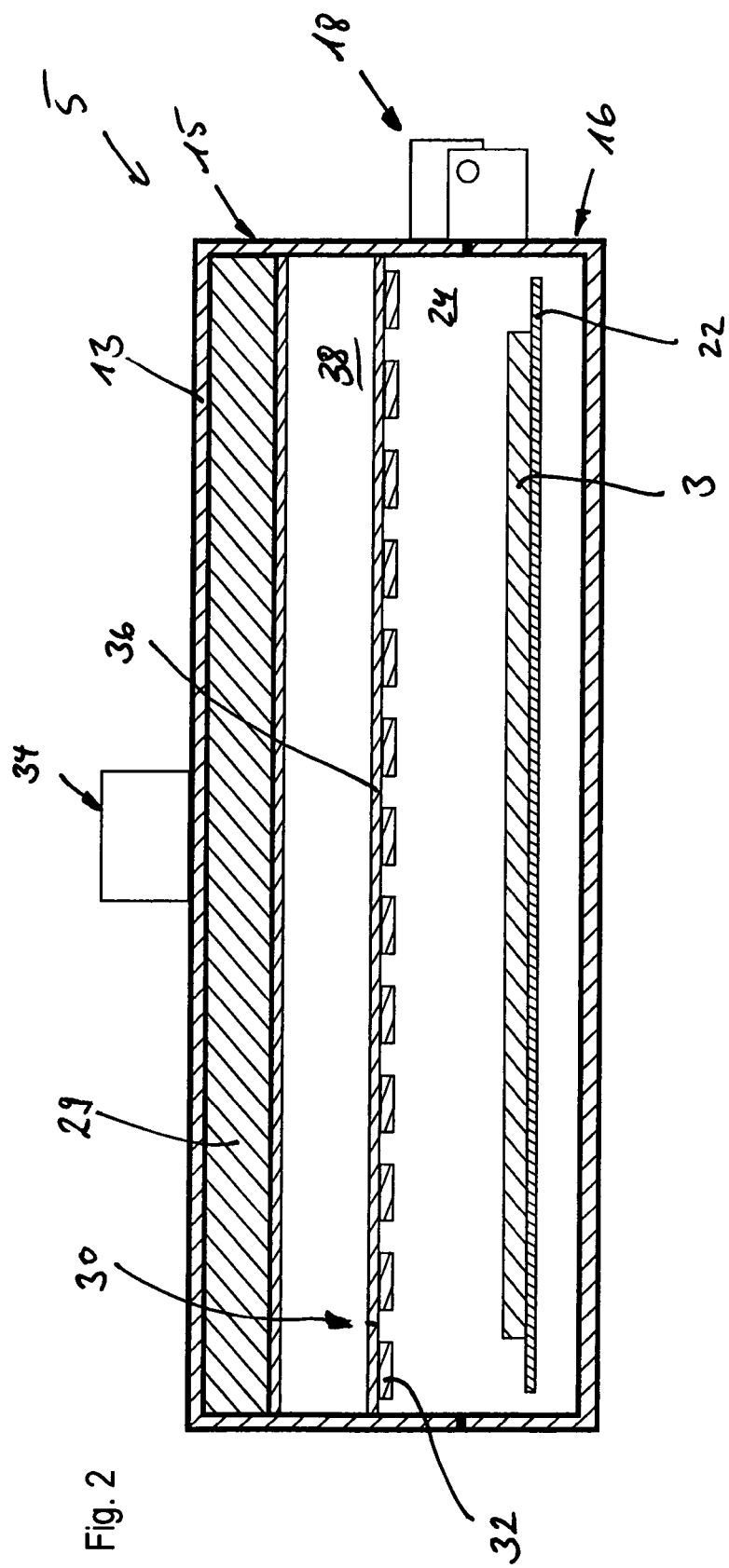
FIG. 2 shows a schematic cross-sectional view of the continuous furnace.
Figure 3:
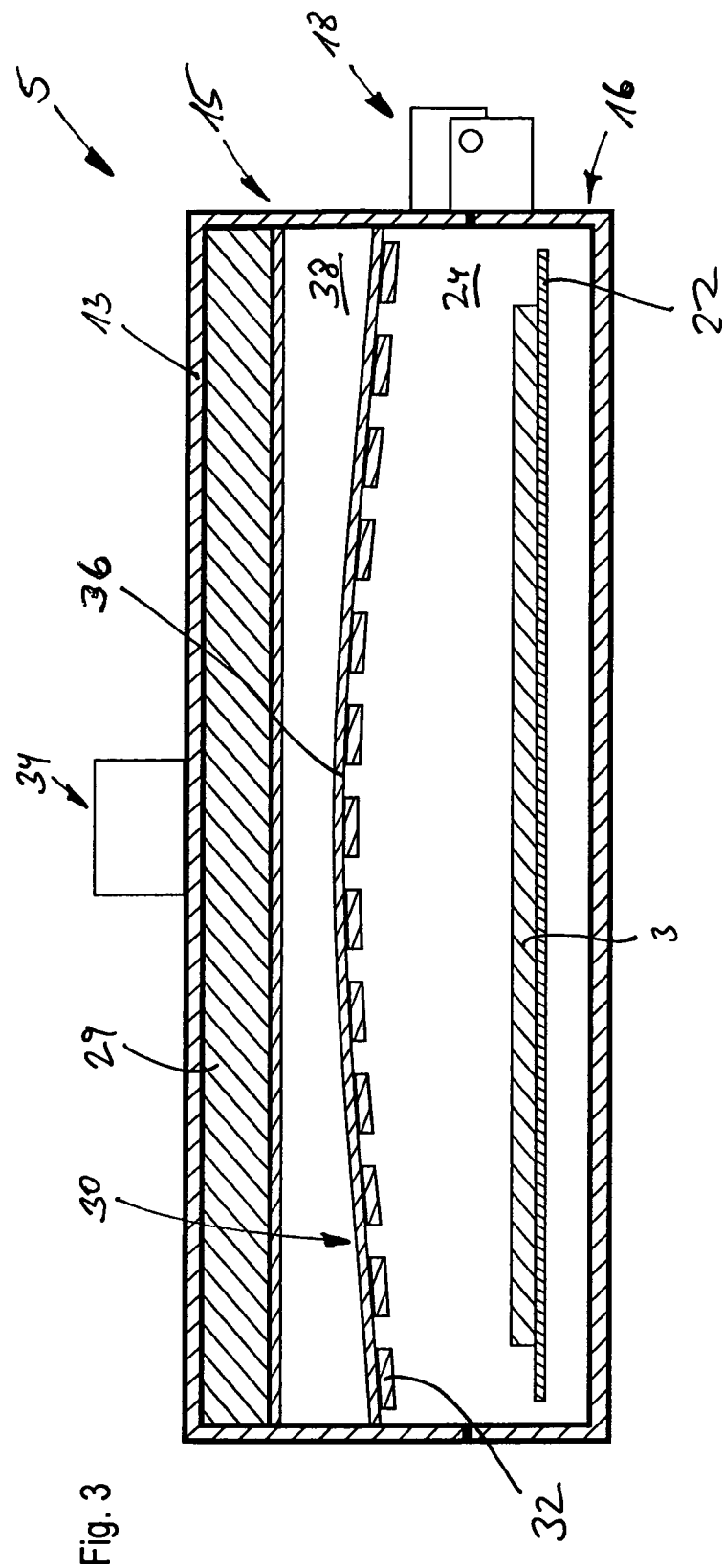
FIG. 3 shows a schematic cross-sectional view of the continuous furnace according to FIG. 2, wherein a heating unit of the continuous furnace is in a different position.
Figure 4:
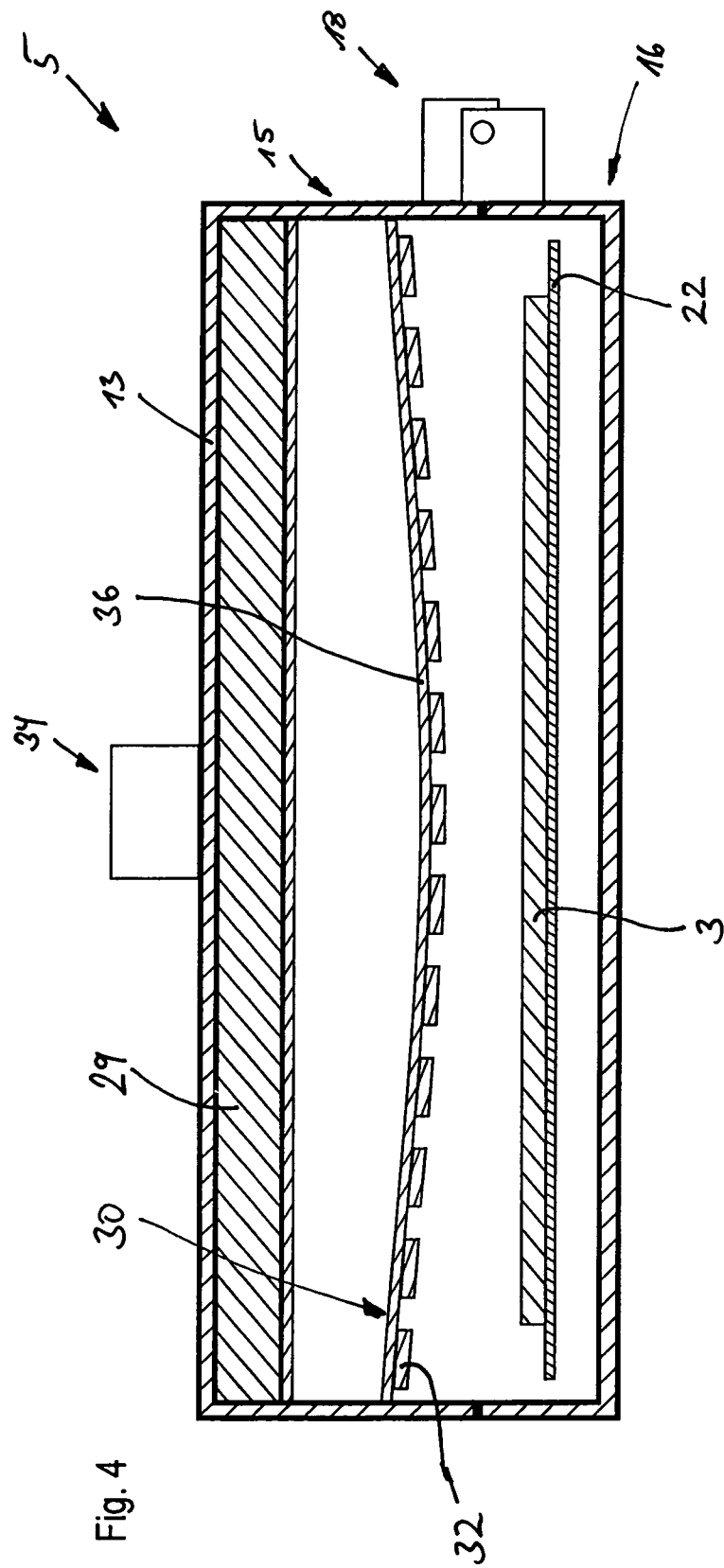
FIG. 4 shows a schematic cross-sectional view similar to FIG. 2 of the continuous furnace, wherein the heating unit of the continuous furnace is in yet another position.

The housing unit 5 generally comprises an extended housing 13 having a rectangular cross-section, as illustrated in FIGS. 2 to 4. The housing 13 of the illustrated embodiment has a top portion 15 and a bottom portion 16, which can be pivoted with respect to each other by means of a pivoting mechanism 18. In particular the top portion 15 can be pivoted upwards with respect to the bottom portion 16 so as to permit access to the interior of housing 13. It is of course also possible, to provide no or different opening and closing mechanisms for housing 13.

In each of the end walls (longitudinal direction) of housing 13 an opening 20 is provided. The respective openings 20 are dimensioned so that a transport belt 22 of the transporting apparatus having substrates 3 placed thereon can extend through the openings. This permits a transport of substrates 3 through the interior space of housing 13, which is discussed in more detail herein below.

Inside the housing 13 a tunnel-shaped heating space 24 is formed. The housing unit further provides a plurality of partition elements 26 extending transverse to the longitudinal direction of housing 13 and partitioning the heating space 24 into a plurality of heating zones 24a, 24b, 24c and 24d. The partition elements 26 are arranged in such a way that each of the heating zones 24a to 24d substantially has the same size. Moreover the partition elements 26 are also arranged in such a way that respective connecting openings 28 having the size of openings 20 remain between the respective heating zones 24a to 24d. These connecting openings 28 are aligned with openings 20 in the end walls, so as to permit a straight line transport of substrates 3 through heating space 24 with its different heating zones 24a to 24d.

In the above description it was assumed that housing 13 is a unitary housing in longitudinal direction comprising a continuous interior space partitioned by partition elements 26. However, it would be possible to provide a plurality of directly adjacent housing modules according to heating zones 24a to 24d. The housing modules could be arranged directly adjacent to each other, thus forming an all but continuous heating space comprising adjacent heating zones corresponding to the modules. The advantage of such a modular construction would be that apparatus 1 can, according to the requirements, easily provide a larger or smaller number of heating zones. The partitioning of heating space 24 described above into several heating zones 24a to 24d is optional. It is also possible to omit such a partitioning and to provide a continuous heating space that is heated in longitudinal direction by one or also by a plurality of heating units 7. In the top region of housing 13, an insulation 29 is provided that can of course also be provided in other regions.

In the illustrated and described embodiment a respective heating unit 7 is provided in each of the heating zones 24a to 24d. Each of the heating units can have the same configuration according to the invention, which is described herein below, however, there can also be different heating units provided in the heating zones 24a to 24d. In the following description it is assumed that each of the heating units 7 has the same configuration, so that only one of them is described in detail.

Each heating unit 7 is composed by a heating element carrier unit 30, a single heating element 32 or a plurality of heating elements 32 and a positional control unit 34.

Heating element carrier unit 30 substantially consists of a flexible carrier element 36, such as a sheet metal. Carrier element 36 is positioned substantially parallel and spaced from a top wall of housing 30. It completely spans heating space 24 in a transverse direction. In a longitudinal direction of the heating space 24 wall elements are provided in the region of each of the ends of flexible carrier element 36, so that a substantially closed space 38 is formed between the top wall of housing 13 and carrier element 36. To this space 38 negative pressure or positive pressure may be applied via the positional control unit 34 for deforming carrier element 36, as indicated by FIGS. 3 and 4. The material of carrier element 36 is preferably chosen so that with the same pressure in chamber 38 and heating space 24 the carrier element exhibits a planar configuration, as indicated in FIG. 2. I.e. the carrier element has a sufficient stability to keep itself and a heating element attached thereto in a planar configuration. However, if there is a sufficiently lower pressure in space 38 compared to heating space 24, then carrier element 36 bends in an upward direction, as illustrated in FIG. 3. In the opposite way, carrier element 36 bends in a downward direction if the pressure in space 38 is sufficiently higher than in heating space 24, as illustrated in FIG. 4. Carrier element 36 of the illustrated embodiment of the apparatus as a continuous furnace is chosen so that a bending of carrier element 36 is substantially transverse to the longitudinal direction, while a bending in the longitudinal direction does not occur. Thus the carrier element 36 is deformed in a cylindrically symmetric manner. This may be caused e.g. by longitudinally extending reinforcement elements (not shown).

Heating element 32/the plurality of heating elements 32 is fixed to the bottom side of carrier element 36 in such a way that it/they follows/follow a respective movement of carrier element 36. This can be done e.g. by gluing, bonding, ceramically fixing, welding, screwing or in any other suitable manner. Heating element 32 is in particular designed in such a way, that it in itself is flexible so as to be able to follow the bending of carrier element 36 by bending itself. To this end a foil heating element made of graphite, CFC, SIC or similar material having a thickness of between 1 and 5 mm, in particular in a range of 1.5 to 2.5 mm, may be used, which of course is, if required, electrically insulated with respect to the carrier element and fixed to the same. Moreover such foil heaters have the advantage of having a low-mass, thus permitting a rapid heating and cooling thereof, which is of advantage in particular in stationary systems.

Figure 6:
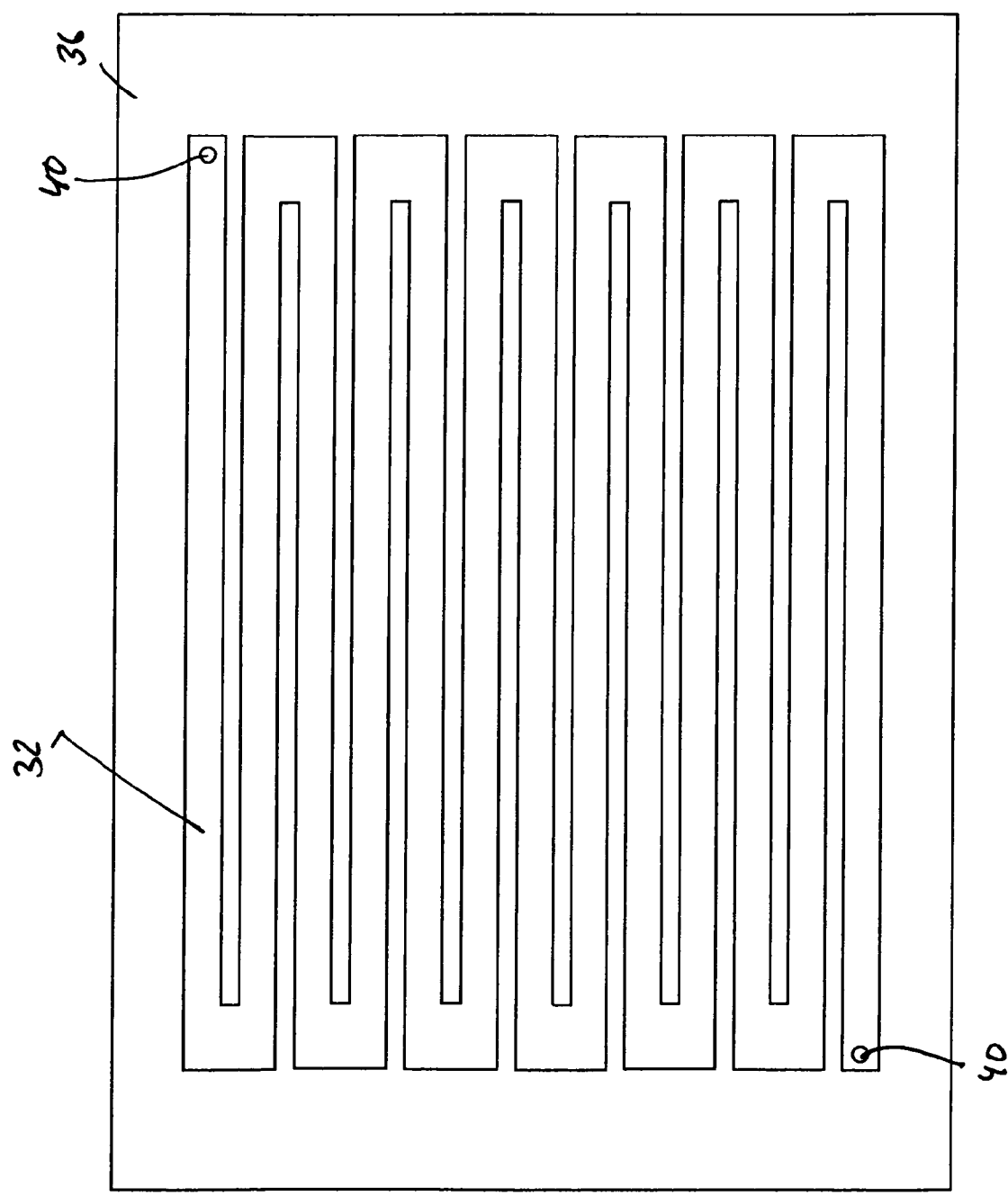
FIG. 6 shows a schematic bottom view of a heating unit according to the invention.
Figure 7:
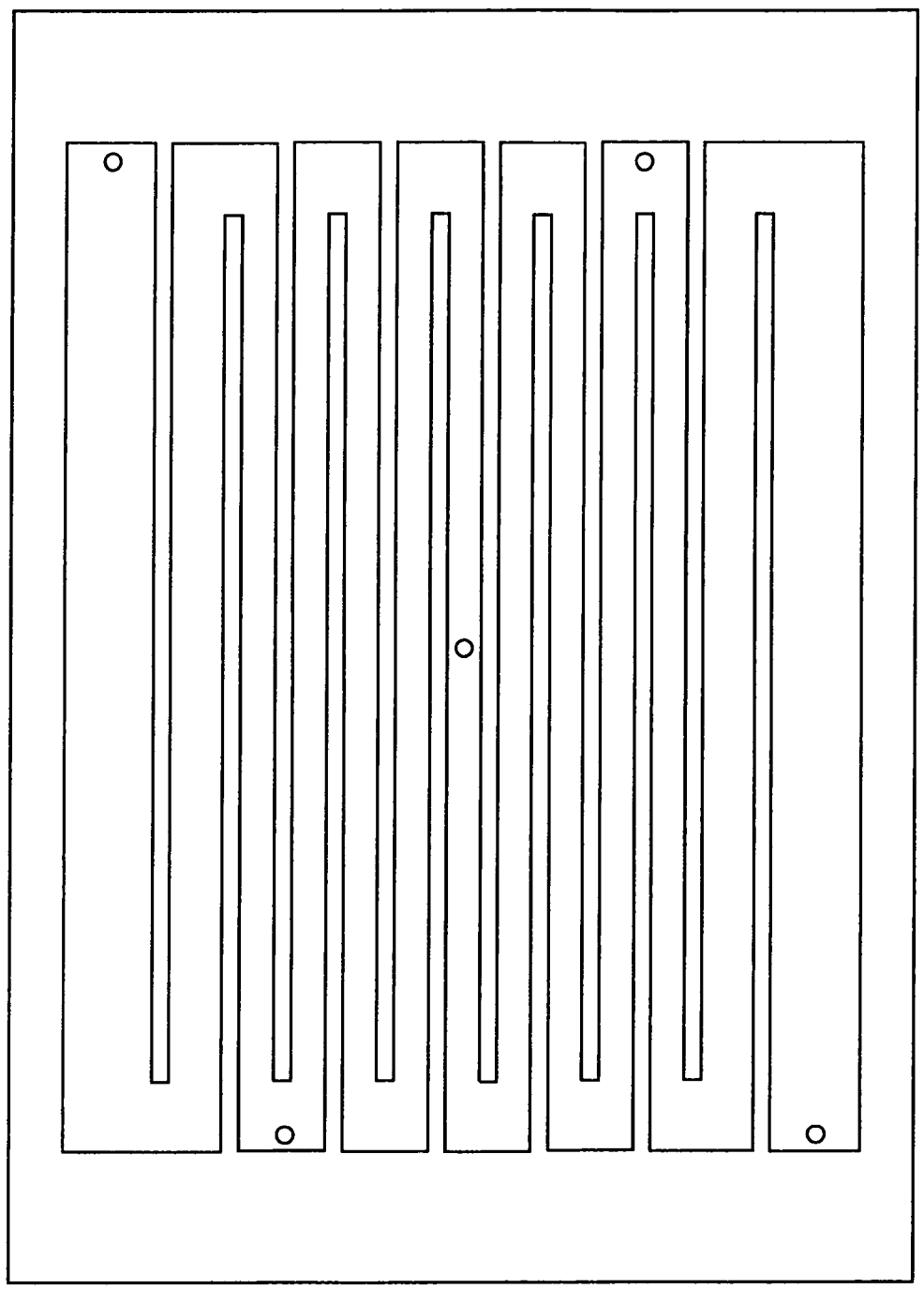
FIG. 7 shows a schematic bottom view of an alternative heating unit of the invention.
Figure 8:
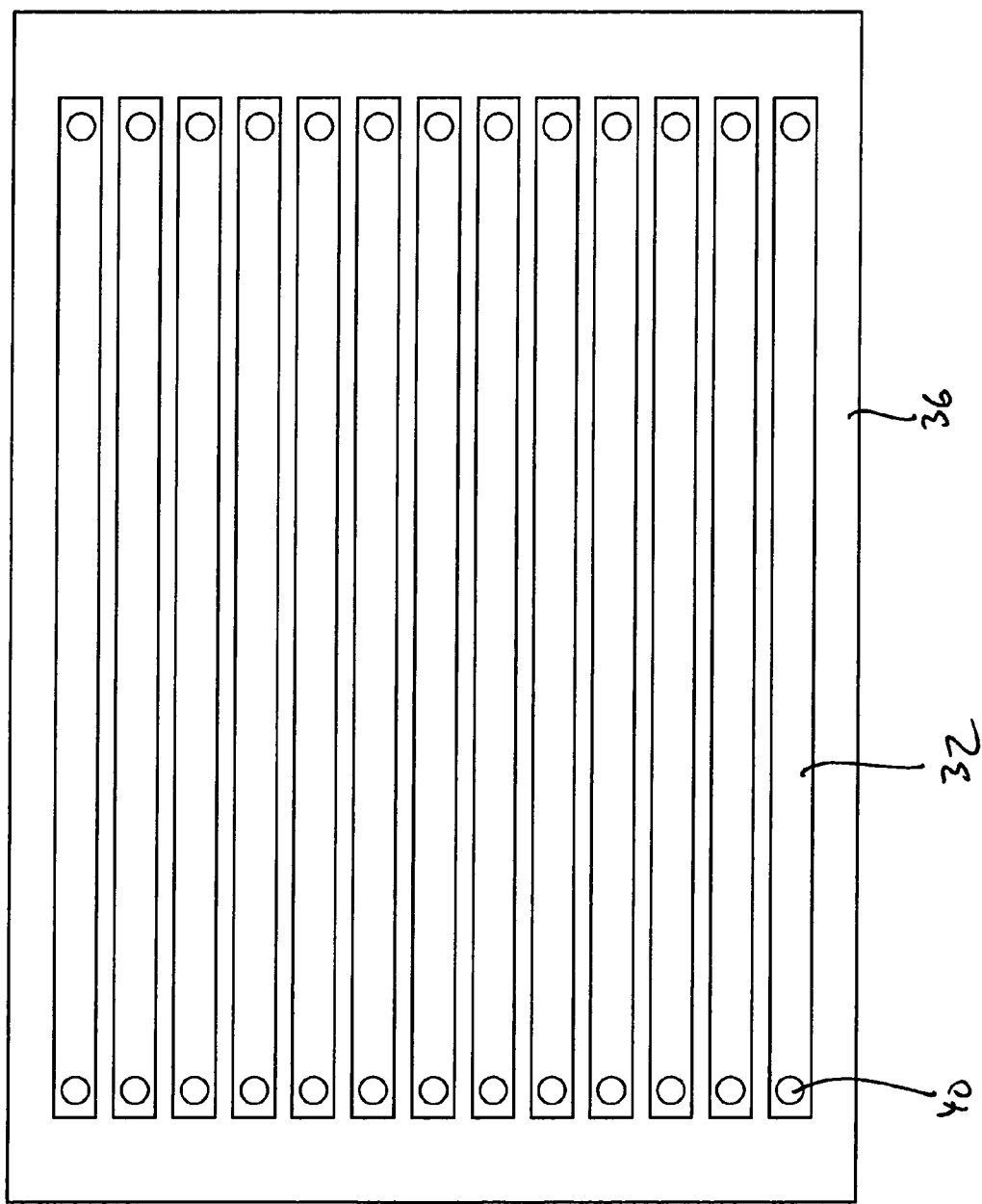
FIG. 8 shows a schematic bottom view of another alternative heating unit of the invention.

FIGS. 6 to 8 show different views from below on carrier element 36 with heating element(s) 32 fixed thereto. In the illustration of FIG. 6 heating element 32 is for example a CFC foil heating element cut in a meander shape. The distances between adjacent meander paths are chosen to be small resulting in a generally continuous, planar emitter. At the opposing ends of the meander a respective contact electrode 40 is illustrated schematically, via which heating element 32 can be supplied with power. Corresponding supply lines to the contact electrodes 40 can for example be provided across space 38 through carrier element 36.

The circumferential shape of heating element 32 is adapted to the shape of the substrates to be treated (in this case rectangular thin film substrates). If substrates with other circumferential shapes are to be treated, e.g. circular substrates, a circular meander or a spiral shape can be provided for the heating element.

In the illustration according to FIG. 6 each of the meander paths is of a homogeneous thickness, so that a substantially homogeneous heating output is provided by the respective meander paths.

FIG. 7 shows an alternative embodiment of heating element 32, which again is constructed e.g. as a CFC foil heater cut in a meander shape. However, here the outer meander paths have a larger width than the ones located on the inside resulting in different heating profiles in the transverse direction. However, the outer meander paths could alternatively also have a different thickness than the inner ones, or could have different widths and/or thicknesses along their current paths. Moreover in the illustration of FIG. 7 several contact electrodes 40 are provided, which allows for a sectional application of power to the meander. Of course a corresponding number of contact electrodes 40 can also be provided in the embodiment according to FIG. 6, so as to be able to set different heating profiles in the transverse direction.

FIG. 8 shows another embodiment of the heating element, in which respective strip-shaped heating elements 32 are for example again provided as foil heating elements to which power can be applied at their opposed ends via a respective contact electrode 40. In this embodiment power can be applied to the heating element 32 individually or in groups.

Figure 9:
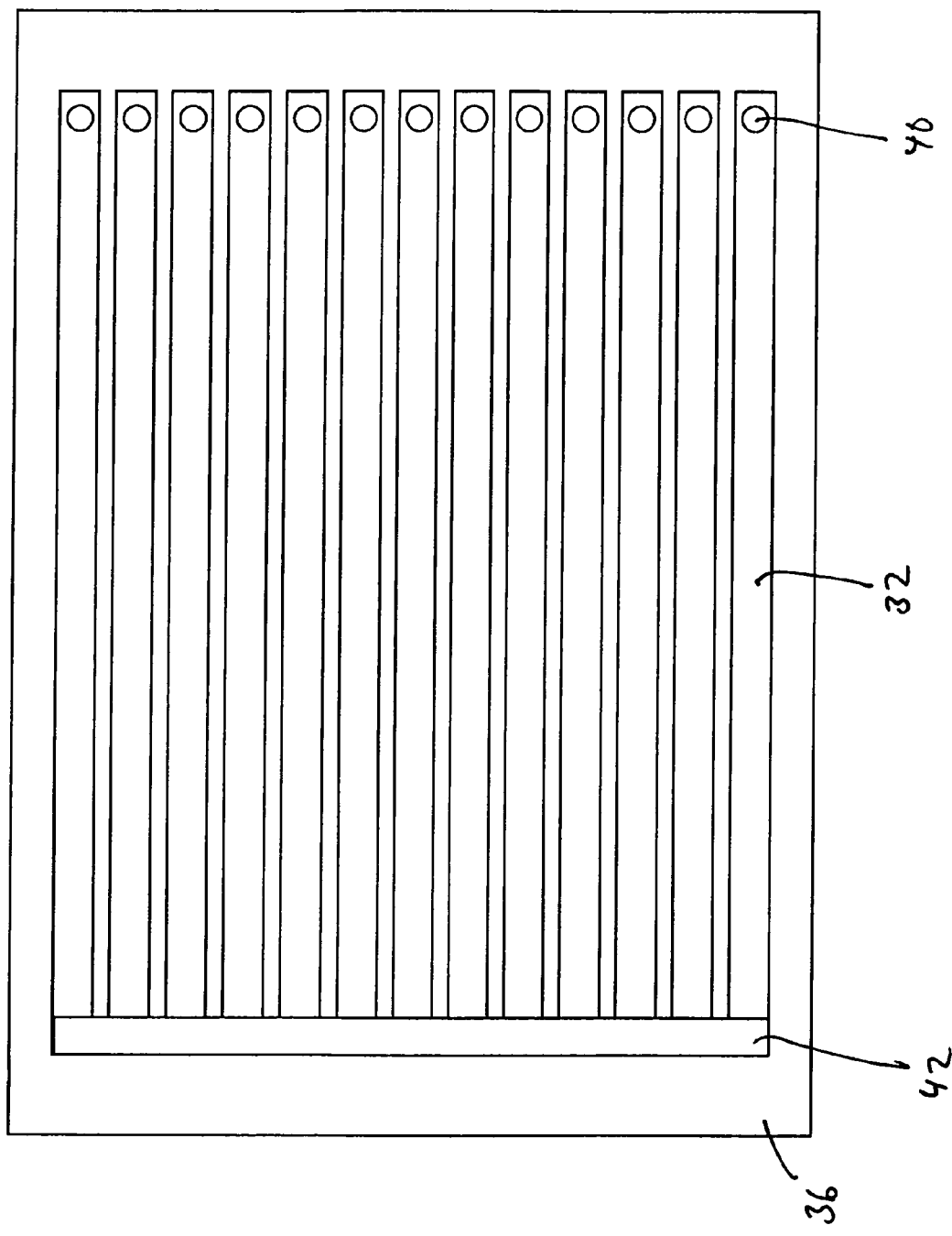
FIG. 9 shows a schematic bottom view of yet another alternative heating unit of the invention.

FIG. 9 shows an embodiment modified with respect to FIG. 8, in which again a plurality of strip-shaped heating elements 32 is provided. The strip-shaped heating elements are each short-circuited at one end via a flexible contact element and are for example connected to ground. Contact electrodes 40 are provided at the opposite ends, which in turn allows for an individual control, group control or common control. As a person skilled in the art will understand, very different options arise for the design of the heating elements or the plurality of heating elements, respectively (e.g. the formation of a meander by distanced strip-shaped heating elements each connected in a pair-wise manner at opposite ends).

Even though the use of flexible foil heaters is preferred, other heating elements can be used, that by themselves do not need to be flexible, if they are for example arranged as in FIG. 8 or FIG. 9. With an adequate arrangement the single heating elements by themselves could be substantially rigid, if a bending of carrier element 36 occurs only in transverse direction. However, carbon-based foil heaters exhibiting an adequate flexibility are preferred, so as to be able to completely follow a curvature of carrier element 36. Such heating elements should not get in contact with oxygen at processing temperatures above 600° C. However, if thermal treatment under the influence of oxygen takes place in heating space 24, it would be conceivable to provide a partition element, such as a quartz plate, between heating elements 32 and the substrate to be treated, partitioning the actual processing space with the processing gases from the heating elements. Between the quartz plate and the heating elements an adequate inert gas, such as nitrogen gas, could then be employed. It could also be employed for the deformation of the carrier element.

In the illustration according to FIGS. 1 to 4 a respective pressure differential between space 38 and heating space 24 is used to achieve the deformation of carrier element 36. Moreover the transport of substrates 3 through heating space 24 is conducted by means of a transport belt.

Figure 5:
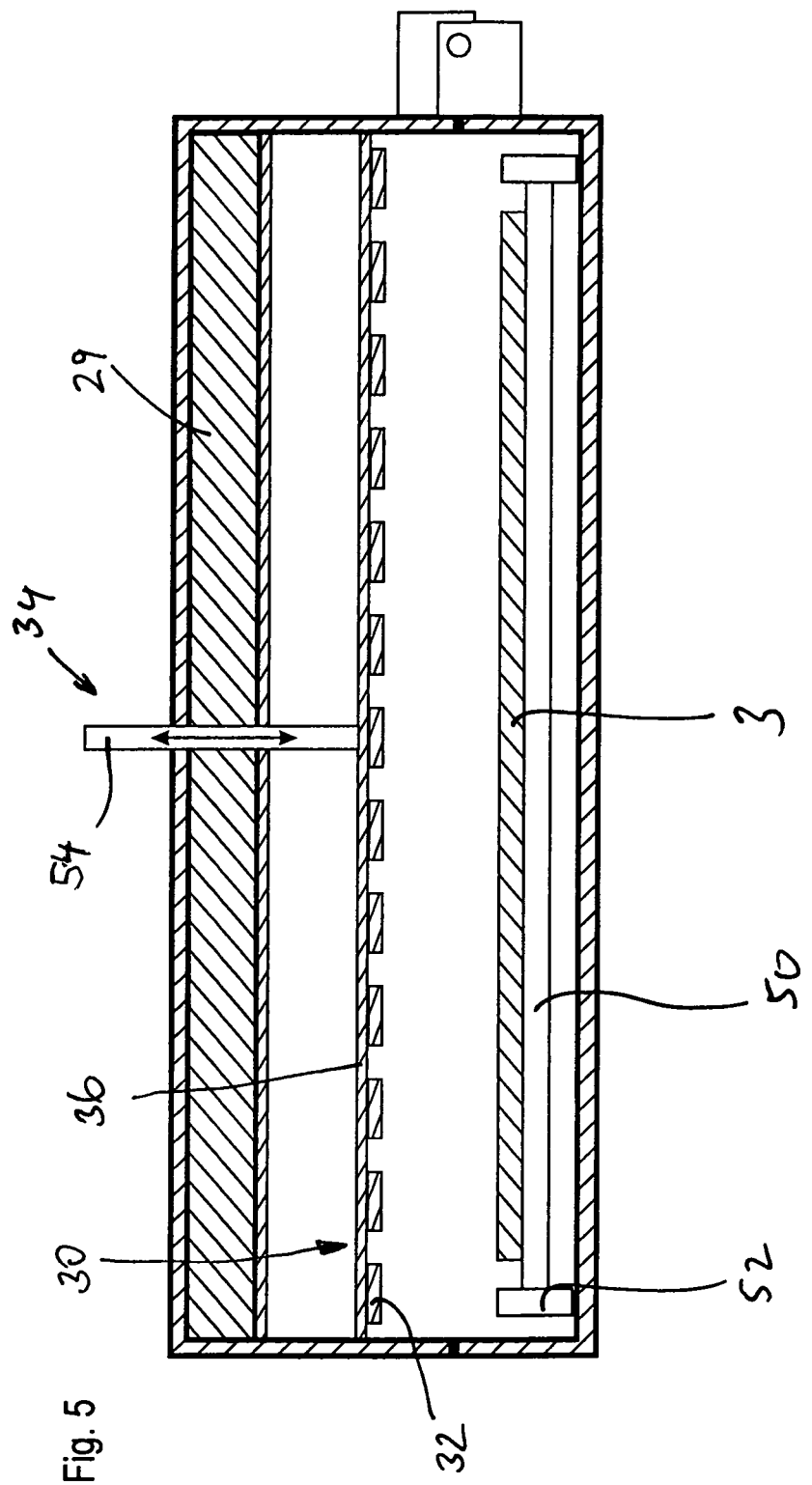
FIG. 5 shows a schematic cross-sectional view of a continuous furnace according to an alternative embodiment of the invention.

FIG. 5 shows an alternative embodiment of apparatus 1 for thermal treatment of substrates 3 differing in these respects. In this embodiment the same reference signs are used when similar or the same parts are described.

The apparatus is substantially to the same as the one described above. It differs, however, with respect to transport unit 9 as well as positioning unit 34. Transport unit 9 does not comprise a transport belt in this embodiment but a plurality of rollers supported at their ends by corresponding roller bearings 52. The rollers 50 and the bearings 52 can be made of metal, quartz or ceramics for high-temperature applications. Rollers 50 can be driven by a corresponding mechanism so as to provide an active transport for substrates 3. Alternatively rollers 50 can be mounted to be freely rotatable, and substrates 3 can be transported through the heating space 24 by a pushing mechanism.

In the embodiment according to FIG. 5 the positioning unit 34 consists of an upward and downward moving shaft element 54 attached to the back side of carrier element 36. As a person skilled in the art will recognize, such a shaft element 54 can cause a corresponding deformation as shown in FIGS. 3 and 4 by an upward and downward movement thereof.

In the following the operation of apparatus 1 is explained in more detail with reference to the figures, based on the embodiment according to FIGS. 1 to 4. The substrates 3 are arranged on transport belt 22 in a spaced manner, and the transport belt 22 is moved through heating space 24 of apparatus 1 in a continuous manner. In the illustration according to FIG. 1 the following description is based on the assumption that the transport belt 22 is moved from left to right through heating space 24. Thus the substrates sequentially pass heating zones 24a, 24b, 24c and 24d during their transport.

Each of the heating units 7 is controlled in the respective heating zones 24a to 24d to provide a predetermined heating profile in the longitudinal direction of heating space 24. In the process the emission profile of heating elements 32 can be adjusted in each heating zone 24a to 24d by a corresponding bending of carrier element 36 as required. In particular, a focusing of the heating output on a central region can be provided, if a bending as illustrated in FIG. 3 is caused. Also a focusing on the edge regions can be achieved if required by bending the carrier element as illustrated in FIG. 4. Moreover the emission profile can also be set within the respective heating zone by a respective control/design of the heating element(s).

A corresponding focusing on the lengthwise center of substrates 3 is for example especially advantageous while increasing the temperature of the substrates. During a temperature holding phase, a homogeneous emission distribution can be advantageous and during a controlled cooling phase, a focusing on the edge regions may be preferred. For example, in one application heating zones 24a and 24b form heat-up zones, heating zone 24c forms a temperature holding zone and heating zone 24d forms a cooling zone for substrates 3 transported through the continuous furnace. In other applications the distribution of tasks can be differently organized. However, the respective carrier elements 36 can be set in view of the task of the respective heating zone as described above.

Even though the present invention was described with reference to a continuous furnace, the principles of the present invention providing for a local adjustment of the spacing or distance between a substrate to be treated and at least one heating element could also be employed advantageously in stationary furnace systems. In such systems a local setting would be possible in the same manner by a deformation of a carrier element. In this case usually a circularly symmetric deformation would be provided instead of a cylindrically symmetric deformation of carrier element 36. Also a respective deformation would be carried out during a heating cycle, since in stationary systems the heating up of a substrate, the holding of the temperature and the controlled cooling are usually controlled by means of a single heating unit.

The invention was described with reference to a flexible carrier element 36. Instead of such a flexible carrier element it would be possible to provide a plurality of carrier elements movable with respect to each other, each of which either individually carries a corresponding heating element or they are connected at different locations with a single heating element. By means of individual positional control of the carrier elements a local distance or spacing adjustment between heating element and substrate could in turn be achieved.

Even though the invention was described by means of preferred embodiments, it should be noted that it is not limited to these presented embodiments. Moreover it should be noted that different aspects of the different embodiments can be freely combined with each other or can be exchanged for one another if they are compatible.

The invention claimed is:

1. An apparatus for the thermal treatment of substrates, in particular large thin film substrates for photovoltaic applications, the apparatus being formed as a continuous furnace comprising a tunnel-shaped heating space having side walls, a bottom wall, and a top wall, the apparatus further comprising:
    a conveying unit for transporting the substrate through the heating space;
    a heating unit having at least one heating element for heating a substrate while the substrate is transported through the heating space by the conveying unit;
    at least one heating element carrier for supporting the at least one heating element, the at least one heating element carrier comprising at least one deformable, flexible element so as to allow for a local change in distance between said conveying unit and said heating unit; and
    means for deforming the flexible element.

2. The apparatus for the thermal treatment of substrates according to claim 1, wherein at least one heating unit is arranged above the conveying unit such that it may heat the substrate from above, and wherein the heating unit is also arranged such that the substrate may freely move underneath the heating unit without contacting the same irrespective of a deformation of the flexible element.

3. The apparatus according to claim 1, wherein the means for deforming the flexible element comprise a chamber adjacent to the flexible element to which a negative pressure and/or a positive pressure can be applied to deform the flexible element.

4. The apparatus according to claim 1, wherein the means for deforming the flexible element comprises a movable element, which is in contact with and preferably connected to the flexible element.

5. The apparatus according to claim 1, wherein the at least one heating element is flexible to be able to provide the local change in distance.

6. The apparatus according to claim 1, wherein the at least one heating element is formed by flexible and rigid sections.

7. The apparatus according to claim 1, wherein the at least one heating element is formed as a planar emitter and/or a foil heater.

8. The apparatus according to claim 1, wherein the at least one heating element comprises at least partially of one of the following materials: graphite, CFC, SIC or similar materials.

9. The apparatus according to claim 1, wherein the at least one heating element is at least partially or locally glued, bonded, welded and/or ceramically fixed to the at least one heating element carrier.

10. The apparatus according to claim 1, wherein at least one of the walls of the tunnel shaped heating space, in particular the top wall, forms the heating element carrier.

11. The apparatus according to claim 10, wherein the conveying unit comprises a transport belt for transporting the substrate through the heating space.

12. The apparatus according to claim 1, wherein the at least one heating element has a meander shape.

13. The apparatus according to claim 1, wherein the at least one heating element comprises a circumferential shape corresponding to the circumferential shape of the substrate to be treated.

14. The apparatus according to claim 1, wherein the local change in distance is cylindrically symmetric.

15. The apparatus according to claim 1, wherein at least one heating element is divided into a plurality of individually controllable sections and/or wherein a plurality of individually controllable heating elements is provided.

16. The apparatus according to claim 1, wherein the at least one heating element comprises different resistances in different section thereof so as to provide sectionally different heating outputs with a uniform input.

\* \* \* \* \*